(12) United States Patent
Koski et al.

(10) Patent No.: US 6,356,071 B1
(45) Date of Patent: *Mar. 12, 2002

(54) SELF-CONTAINED POSITION DETECTION APPARATUS

(75) Inventors: Richard D. Koski, Troy; Anthony L. Jenkins, Clawson, both of MI (US)

(73) Assignee: Patriot Sensors & Controls, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/063,145

(22) Filed: Apr. 20, 1998

Related U.S. Application Data (63) Continuation-in-part of application No. 08/848,981, filed on May 2, 1997, now Pat. No. 5,948,255.

(51) Int. Cl.⁷ .......................... G01B 7/14; G01F 23/30; H03H 9/22
(52) U.S. Cl. ................... 324/207.13; 73/290 V
(58) Field of Search .................... 324/207.13, 207.24, 324/207.25; 73/313, 314, 290 V; 333/148

(56) References Cited

U.S. PATENT DOCUMENTS

| | | |
|---|---|---|
| 4,678,993 A | 7/1987 | Vinnemann et al. |
| 4,939,457 A | 7/1990 | Tellerman |
| 4,943,773 A | 7/1990 | Koski et al. |
| 4,958,332 A | 9/1990 | Tellerman |
| 5,006,797 A * | 4/1991 | Smith .................... 324/207.25 |
| 5,017,867 A | 5/1991 | Dumais et al. |
| 5,050,430 A | 9/1991 | Begin et al. |
| 5,076,100 A | 12/1991 | Hunter et al. |
| 5,136,884 A | 8/1992 | Lovett |
| 5,196,791 A | 3/1993 | Dumais |
| 5,258,707 A | 11/1993 | Begin et al. |
| 5,274,328 A | 12/1993 | Begin et al. |
| 5,313,160 A | 5/1994 | Golden et al. |
| 5,406,200 A | 4/1995 | Begin et al. |
| 5,412,316 A | 5/1995 | Dumais et al. |
| 5,473,245 A | 12/1995 | Silvus, Jr. et al. |
| 5,680,041 A * | 10/1997 | Begin .................... 324/207.13 |

* cited by examiner

Primary Examiner—Walter Snow
(74) Attorney, Agent, or Firm—Young & Basile, P.C.

(57) ABSTRACT

A position detector includes an outer tube of having a magnetostrictive wire disposed therein. An electric circuit is mounted completely within the outer tube and is electrically connected to a pickup coupled to the magnetostrictive wire. A multi-pin connector is mounted at one end of the outer tube for coupling conductors extending from the circuit in the outer tube to external conductors. In an alternative embodiment, the position detector includes a threaded adapter threadingly mountable within an end wall of a pressurized fluid operated cylinder. Conductors extend from the circuit in the outer tube through the adapter to an external connector.

19 Claims, 7 Drawing Sheets

SELF-CONTAINED POSITION DETECTION APPARATUS

CROSS-REFERENCE TO RELATED APPLICATION

This application is a continuation-in-part of U.S. patent application Ser. No. 08/848,981, filed May 2, 1997, now U.S. Pat. No. 5,948,255 in the name of Richard Koski and entitled "Self Contained Liquid Level Detection Apparatus with Substantially Constant Cross-Section Outer Tube". The contents of this application are incorporated herein by reference.

BACKGROUND OF THE INVENTION

Field of the Invention

The present relates, in general, to magnetostrictive position transducers.

The phenomenon of magnetostriction has been widely employed in linear distance and position measuring devices. A magnet located near or around a magnetostrictive wire marks the location to be measured. Such devices can operate with either mechanical or electrical excitation. When an acoustical/mechanical strain propagating along the wire reaches the area of influence of the magnet, an electrical signal is generated in the wire. Conversely, when an electrical signal propagating along the wire reaches the area of influence of the magnet, a torsional strain is generated in the wire.

Such linear position detectors using a magnet mounted in a float have been utilized as liquid level detectors to provide an indication of a level of liquid within a tank, such as an underground tank. The position of the magnet, and hence, the liquid level, is determined as a function of the time required for a torsional disturbance to propagate from one end of the wire through the area of influence of the magnet, in the case of mechanical excitation, or from the position of the magnet to a sensing apparatus located at one end of the wire in the case of electrical excitation.

Other types of magnetostrictive position measuring devices utilize a reflective termination at the foot end of the magnetostrictive wire. Such devices measure the difference between the propagation times of a pulse from the magnet position to the foot of the wire and reflected back to the head of the device and a pulse traveling on the wire directly from the magnet to the head.

As shown in U.S. Pat. Nos. 4,839,590; 5,017,867; 5,050,430; and 5,253,521, all of which are assigned to the assignee of the present invention, such magnetostrictive devices include an elongated, small diameter tube, typically made of stainless steel, on which a movable magnet is mounted for providing an indication of a liquid level. An enlarged head and cap are mounted on one end of the tube, typically above the liquid level and enclose electronic components, such as terminal connections and a signal conditioning circuit used to supply or output signals to and from the magnetostrictive wire in the tube. As shown in these prior art patents, the head has a considerably larger diameter than the diameter of the elongated tube extending through the tank.

Fluid tanks, such as underground gasoline or fuel tanks, are typically provided with one or more risers or hollow conduits mounted on a top surface of the tank and extending upward to an upper end which is located at ground level. One riser is usually employed for filling the tank and typically will have a diameter of approximately four inches. A second smaller riser, such as a two inch diameter riser, may also be provided as a vent.

Existing tanks which are buried underground and which were not provided with the expectation of using liquid level detection within the tank, typically will not have a large riser or a riser dedicated to liquid level detection. Thus, where it is desirable to provide liquid level detection to such existing underground tanks, previously devised magnetostrictive positioning measuring devices having an enlarged head cannot fit within the fill nozzle of the existing riser on such tanks or will completely fill the interior of the riser thereby preventing the insertion of a fuel nozzle into the riser. The only recourse in such situations is to dig up the existing tank and add a riser specifically for a liquid level detection apparatus.

Thus, it would be desirable to provide a liquid level or position detection apparatus which can be easily mounted in tanks or vessels having small diameter risers. It would also be desirable to provide a liquid level or position detection apparatus which can be easily mounted in existing underground tanks without the need for digging up the tank. It would also be desirable to provide a liquid level detection apparatus in which all of the components of the apparatus are contained within a small diameter tube which is insertable into the tank. It would also be desirable to provide a position detection apparatus which can be mounted in any linear measurement device, such as a pressurized fluid operated cylinder for detecting the position of the piston of the cylinder in all mounting positions of the cylinder.

SUMMARY OF THE INVENTION

The present invention is a position detector suitable for detecting the position of a movable member carrying a magnet.

In one embodiment, the present invention is a position detector apparatus having a magnetostrictive wire extending through a measurement field with at least one magnet moveable through the measurement field for providing disturbances in the magnetostrictive wire. The apparatus comprises: an outer magnetic transmissive tube, having opposed first and second ends, a magnetostrictive wire is fixedly mounted within the outer tube. Pickup means are mounted within the outer tube and coupled to the magnetostrictive wire for outputting signals propagating along the magnetostrictive wire. Circuit means are disposed completely within the outer tube for coupling electrical signals to the magnetostrictive wire and the pickup means and for transmitting electric signals from the magnetostrictive wire and the pickup means. Fitting means are fixedly mounted in the first end of the outer housing, the fitting means containing a plurality of pins electrically engagable at one end to conductors extending from the circuit means and to external conductors at another end.

In another embodiment, the position detector is adapted for use with a fluid operated cylinder having a piston slidably mounted within a chamber between opposed first and second end walls and a piston rod fixed on the piston and extensibly projecting through an aperture in the second end wall. The position detector comprises an outer magnetic transmissive tube having opposed first and second ends. A magnetostrictive wire is fixedly mounted within the outer tube. Pickup means are mounted within the outer tube and coupled to the magnetostrictive wire for outputting signals propagating along the magnetostrictive wire. Circuit means are disposed completely within the outer tube for coupling electrical signals to the magnetostrictive wire and the pickup means and for transmitting electric signals from the magnetostrictive wire and the pickup means.

A magnet is mounted on the piston. The piston rod is hollow and slidably receiving the outer tube therein. Connector means are carried on a first end of the outer tube for fixedly mounting the first end of the outer tube to the first end wall of the cylinder the fitting means being disposed completely within the external surface of the first end wall.

The apparatus also defines an embodiment wherein the circuit board is fixedly mounted on the inner tube carrying the magnetostrictive wire. Means are provided for centering the circuit board within the outer tube. In a preferred example, the centering means comprises an annular disc mounted about the circuit board and having an outer annular groove. The outer tube is crimped at the position of the annular groove in the disc to fixedly join the outer tube to the disc and thereby fixedly position the circuit board and the inner tube relative to the outer tube.

The present invention provides several improvements over previously devised position detectors or liquid level detectors employing magnetostrictive waveguides. In addition, a unique flush mount adapter is provided for the position detector apparatus and mounted on one end of the outer tube for flush mounting within the end wall of a pressurized fluid operated cylinder. This enables such cylinders to use a position detector of the present invention in substantially all mounting positions of the cylinder, including positions where the end wall is fixedly joined to other components, such as a trunnion, etc.

BRIEF DESCRIPTION OF THE DRAWING

The various features, advantages and other uses of the present invention will become more apparent by referring to the following detailed description and drawing in which.

DESCRIPTION OF THE PREFERRED EMBODIMENTS

Figure 1A:
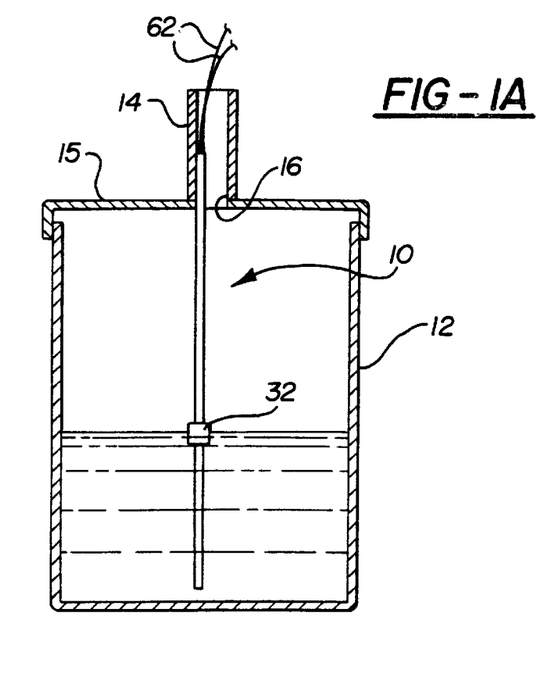
FIG. 1A is a cutaway, side elevational view of a liquid level detection apparatus constructed in accordance with the teachings of the present invention.

Referring now to the drawing, and to FIGS. 1A–4 in particular, there is depicted a liquid level detection apparatus 10 constructed in accordance with the teachings of the present invention. The detection apparatus 10 is depicted as being mounted in a fixed relationship within a liquid containing tank 12, such as a gasoline tank, the liquid level in which may vary from empty to a full condition. In FIG. 1A, the tank 12 is illustrated as being slightly less than half full by way of example only. A riser 14 is mounted on the top cover of the tank 12 and extends upward generally to ground level. The riser 14 provides access to the interior of the tank 12 for the supply of liquid to the tank 12 and/or the discharge of liquid from the tank 12 through an aperture 16 located within the top cover 15 of the tank 12. Although not shown in FIG. 1A, a filler liner including a check valve and a fuel nozzle connection fitting may be mounted within the riser 14.

Figure 1B:
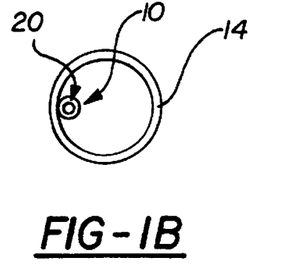
FIG. 1B is a plan view of the riser portion of the tank incorporating a liquid level detection apparatus according to the present invention as shown in FIG. 1.
Figure 1C:
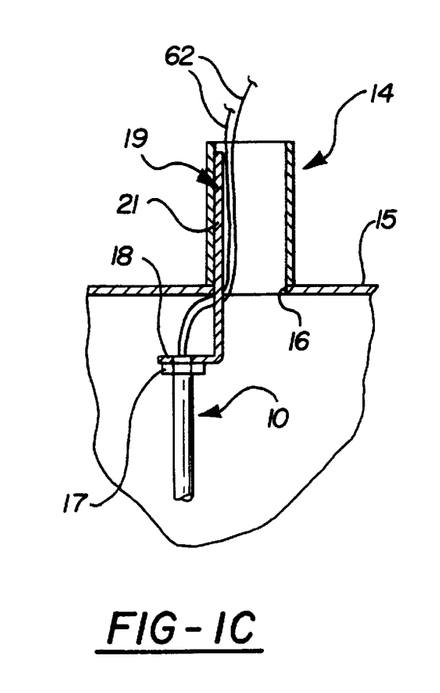
FIG. 1C is an enlarged, partial cross-sectional view showing an alternate mounting arrangement for the liquid level detection apparatus of the present invention in a tank with a riser.
Figure 4:
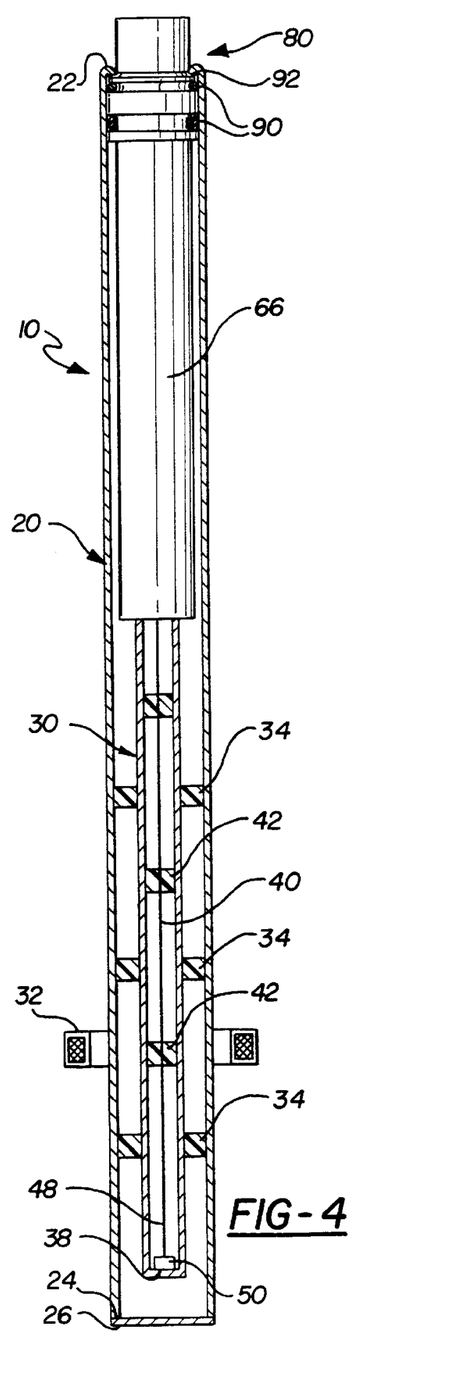
FIG. 4 is a partially broken away, side elevational view of the complete liquid level detection apparatus shown in FIGS. 1 and 3.

The liquid level detection apparatus 10 of the present invention, in the embodiment shown in FIGS. 1A and 1B, extends through the aperture 16 in the top of the tank 12. Alternately, as shown in FIG. 1C, the liquid level detection apparatus 10 is mounted by means of a clamp 17 or other fastener arrangement, to one leg 18 of bracket 19. The bracket 19 also includes a second leg 21 orientated generally perpendicular to the first leg 18. The second leg 21 is designed to abut and be fixedly attached to the riser 14 as shown in FIG. 1C. In this manner, the top end of the liquid level detection apparatus 10 is spaced below, but in close proximity to the top cover 15 of the tank 12. The liquid level detection apparatus 10, as shown in FIG. 4, includes an outer conduit or tube 20 of substantially constant diameter between a first end 22 and an opposed second end 24. The second end 24 is closed by an end cap 26 which is attached to the tube 20 by welding, etc. The outer tube 20 is provided in any required length between the first and second ends 22 and 24 depending upon the overall size of the tank 12 in which the liquid level detection apparatus 10 is employed. The outer tube 20 is formed of any non-magnetic material so as to be magnetically transmissive. Brass, stainless steel and even plastic may be employed to form the outer tube 20.

An optional inner tube 30 is disposed within the outer tube 20 and extends over a substantial portion of the length of the outer tube 20, at least through a measurement area determined by the range of movement of a magnet 32 along the outer surface of the outer tube 20. A plurality of annular spacers 34 are positioned along the inner surface of the outer tube 20 to center and support the inner tube 30 within the outer tube 20. The spacers 34 are formed of a non-magnetic material, such as plastic, brass, etc.

Figure 2:
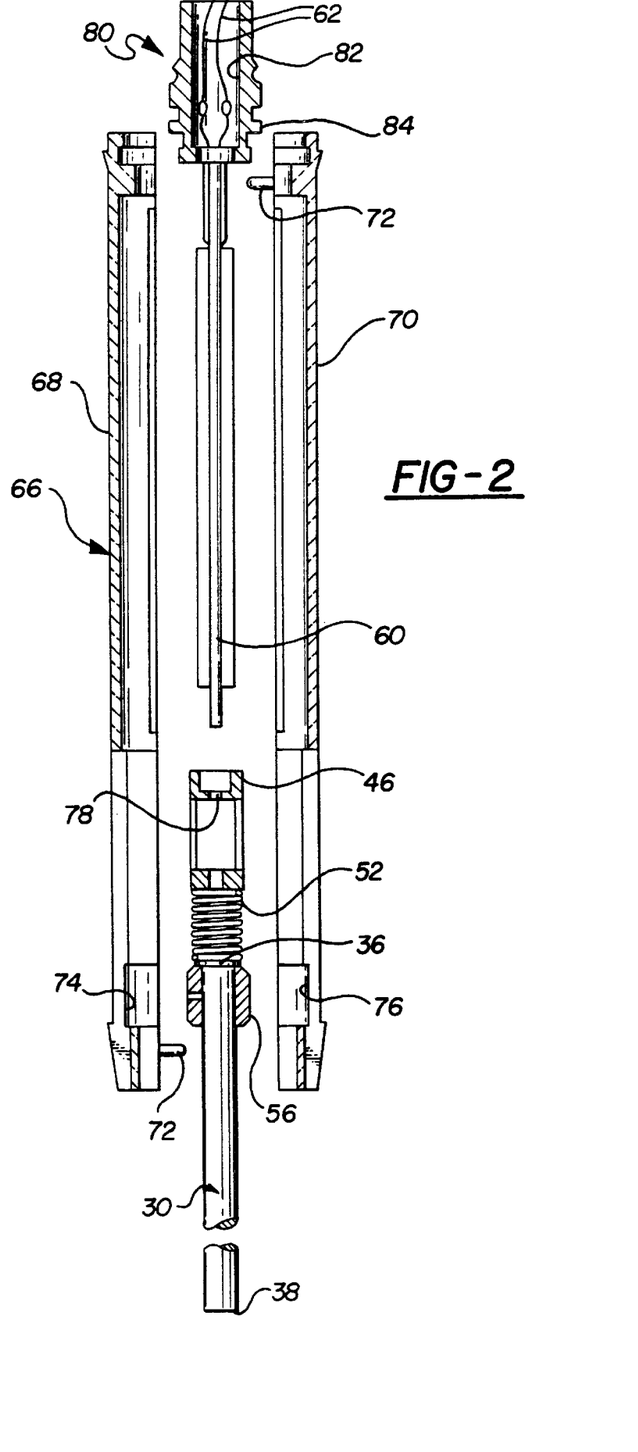
FIG. 2 is an enlarged, partially cross-sectioned, exploded, view of the apparatus shown in FIG. 1.
Figure 3:
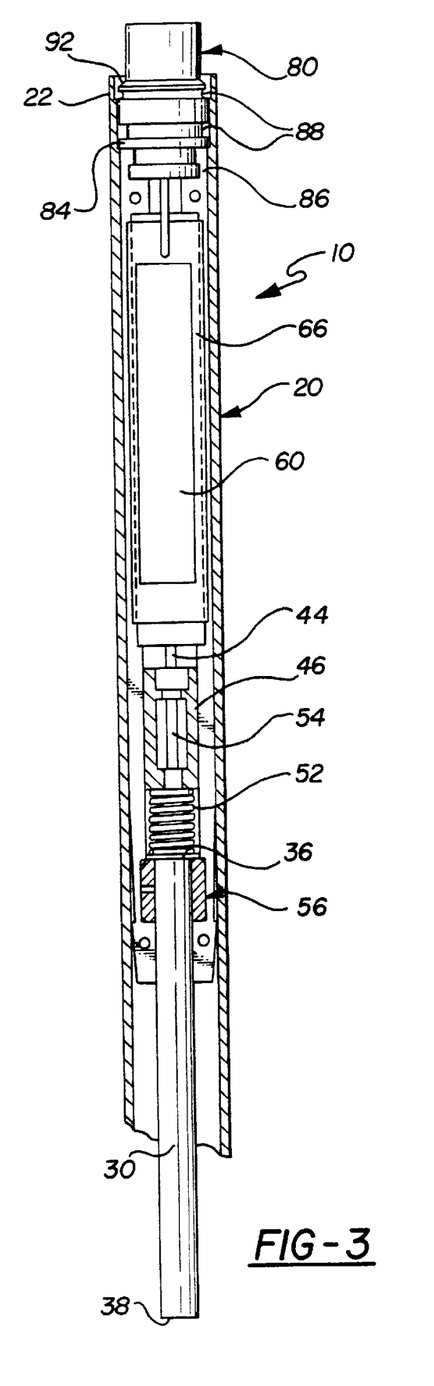
FIG. 3 is an enlarged, partially cross-sectioned, assembled view of the apparatus shown in FIG. 2.

As shown in FIGS. 2–4, the inner tube 30 has an open first end 36 and an opposed, closed second end 38. A thin magnetostrictive wire 40 is disposed within the inner tube 30 and held therein by means of a plurality of annular spacers 42 which are formed of a soft non-interfering material.

The magnetostrictive wire 40 has a first end 44 which is fixedly mounted on a carrier or substrate 46 by way of example only. A second end 48 of the wire 40 is connected to the second end 38 of the inner tube 30 by means of a fixed connection or shackle 50 shown in FIG. 4. Reflective terminations, such as the reflective termination shown in U.S. Pat. Nos. 5,253,521 and 5,017,867, may also be employed to connect the second end 48 of the wire 40 to the second end 38 of the inner tube 30. The magnetostrictive wire 40 is preferably formed of nickel/iron alloy. A material known as Nispan C is suitable for use as the magnetostrictive wire 40.

A biasing means or spring 52 is interposed between the first end 38 of the inner tube 30 and one end of the carrier 46 to maintain the wire 40 in a straight, elongated form within the inner tube 30.

A pickup 54 is mounted on the carrier 46 and surrounds or is disposed in contact with the wire 40. The pickup or transducer 54 may be any suitable pickup or transducer employed in magnetostrictive liquid level detection apparatus. For example, a small rectangular piezoelectric crystal can be clamped to one end of the magnetostrictive wire 40. The piezoelectric crystal operates as a transducer such that a localized strain propagating along the wire 40 causes the crystal to expand in one direction inducing a voltage in the crystal.

Alternately, a coil may be mounted on the carrier 46 and concentrically surrounds the wire 40. Two conductors extend from the pickup 54. In addition, a single conductor, not shown, is connected to the first end 44 of the wire 40. A second or return conductor is connected to the inner tube 30 which acts as a return path. By example only, the return conductor is connected to an electrically conductive, non-magnetic collar 56, shown in FIGS. 2 and 3, which is fixedly mounted, such as by soldering, to the first end 36 of the inner tube 30. Preferably, the collar 56 is formed of brass or other non-magnetic material.

The conductors extending from the pickup 54, the wire 40 and the return wire are connected to a circuit means mounted on a circuit board 60. Terminal pads are provided on the circuit board and receive solder connections to the various conductors. Two conductors extend from an opposite end of the circuit board 60 to a glass filled seal connections. Two external conductors 62 pass outwardly from one end of the outer tube 20 and are connected to a remote controller or circuit. The two conductors 62 form a two-wire loop which provides a current output when a voltage is applied thereto, which indicates the position of the magnet 32 along the length of the outer tube 20. Alternately, the two conductors 62 may be used to provide an output pulse signal indicative of the propagation time of the induced signal along the magnetostrictive wire 40.

In one example of the present invention, the circuit means or board 60 is contained within a housing 66, shown generally in FIG. 4, and in greater detail in FIGS. 2 and 3. The housing 66 is formed of two matingly interconnectable and separable halves or portions 68 and 70. The first and second portions 68 and 70 are generally symmetrical in configuration and include pins 72 at opposite ends which engage apertures formed in the opposite ends of opposed first or second portions 68 and 70 for releasably connecting the first and second portions 66 and 68 together to form a complete housing surrounding the circuit means or board 60. The first and second housing portions 68 and 70 are each formed with annular recessed portions 74 and 76 which form an annular seat for the brass collar 56. Since the brass collar 56 is fixedly mounted on one end of the inner tube 30, this arrangement provides a fixed mounting of the first end 36 of the inner tube 30 within the housing 66. Further, one end of the circuit board 60 seats within an aperture or slot 78 in one end of the carrier 46 to fixedly couple the circuit board 60 to the carrier 46.

A fitting 80 is mountable through the first end 22 of the outer tube 20 as shown in FIGS. 2–4. The fitting 80 includes a through bore 82 which receives the two conductors 62 therethrough prior to further receiving a potting or sealing compound, not shown, which completely fills the bore 82. An annular end surface 84 is formed at one end of the fitting 80 and seats in a shoulder 86 spaced from the first end 22 of the outer tube 20 to axially position the fitting 80 relative to the outer tube 20. Annular recesses 88 are formed externally on the fitting 80 and receive seal members, such as O-rings 90, shown in FIG. 4, to sealingly couple the fitting 80 to the outer tube 20. As also shown in FIG. 4, once the fitting 80 has been positioned within the first end 22 of the outer tube 20, the first end 22 of the outer tube 20 is rolled or bent radially inward into engagement an annular flange 92 at one end of the fitting 80 to fixedly mount the fitting 80 in the first end 22 of the outer tube 20.

In assembling the liquid level positioning apparatus 10 of the present invention, the circuit board 60, the carrier 46, the spring 52, the collar 56 and the first end 36 of the inner tube 30 are axially arranged as shown in FIG. 2 in one of the first and second housing portions 68 and 70. The wires extending to and from the collar 56, the pickup 54 and the magnetostrictive wire 40 are connected to the terminal pads on the circuit board 60. Conductors are also connected to terminal connections on the other end of the circuit board 60 through the glass filled seals. The external conductors are connected to the glass filled seals and are passed through the bore 82 in the fitting 80 when the fitting 80 is brought into proximity with the circuit board 60. The first and second housing portions 68 and 70 are then snapped into fixed engagement to maintain the fitting 80, the circuit board 60, the carrier 46, the spring 52 and the first end 36 of the inner tube 30 in the illustrated axial arrangement while maintaining an elongation force on the magnetostrictive wire 40.

The assembly is then inserted into the first end 22 of the outer tube 20 and the first end 22 of the outer tube 20 bent inward into engagement with the flange 92 on the end fitting 80. This supports the entire inner tube 30 and the housing 66.

It will be understood that in a simplest form, the liquid level detection apparatus 10 of the present invention may include only the outer tube 20, the magnetostrictive wire 40 and the circuit 60 on which the pickup 54 is mounted. The return wire extends from one end of the magnetostrictive wire 40 to the circuit 60. The circuit 60 can be fixedly mounted at one end of the outer tube 20 so as to apply tensile force to the magnetostrictive wire 40.

Figure 5:
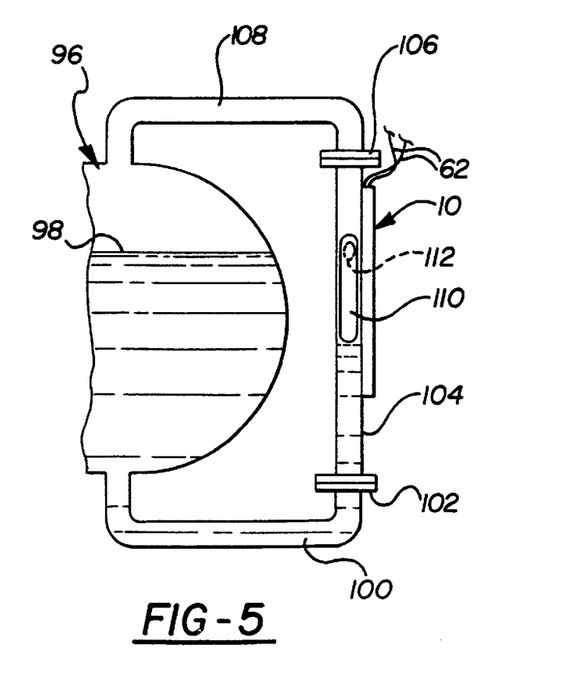
FIG. 5 is a side elevational view showing the liquid level detection apparatus of FIG. 1 mounted on liquid tank sight glass.

FIG. 5 depicts another application of the liquid level detection apparatus 10 of the present invention. In this embodiment, a liquid vessel or tank 96, typically one employed to process fluid in an industrial process contains liquid movable at various levels 98. A lower conduit 100 extends from the bottom or near the bottom of the tank 96 and forms a fluid flow path through mounting flanges 102 to a standpipe or stand glass 104. Mounting flanges 106 provide a connection for an upper conduit 108 to the upper portion of the tank 96. This type of standpipe is well known and includes a float 110 in which a magnet 112 is contained. Since the standpipe 104 is disposed in fluid communication with the liquid within the tank 96, the float 110 floats on the surface or liquid level in the standpipe 104 which corresponds to the liquid level 98 in the tank 96.

In this application, the liquid level detecting apparatus as described above is fixedly mounted on an exterior surface of the standpipe 104 between the mounting flanges 102 and 106 and extends over the range of movement of the magnet 112 in the float 110. Since the apparatus 10 is wholly contained within the interior of the outer tube 20, the apparatus 10 may be mounted immediately adjacent to or directly on the exterior surface of the standpipe 104 without special mounting brackets or arrangements previously required by the mounting flanges 102 and 106. This enables the liquid level detecting apparatus 10 of the present invention to be easily employed in a standpipe tank application regardless of the particular standpipe mounting flange arrangement.

Referring now to FIGS. 6–12, there is depicted a detection apparatus 114 according to the present invention. The detection apparatus 114, like the liquid level detection apparatus 10 described above, is suited both for position detection as well as liquid level detection. As the detection apparatus 10 includes certain elements or components which are identical to elements or components of the apparatus 10 described above, the same reference numeral has been utilized to depict the same component or element in both embodiments of the present invention.

Thus, the detection apparatus 114 includes an outer conduit or tube 20 of substantially constant diameter between a first end 22 and an opposed second end 24. The outer tube 20 is provided in any required length between the first and second ends 22 and 24. Preferably, the outer tube 20 is formed of a non-magnetic material so as to be magnetically transmissive. Brass, stainless steel, and even plastic may be employed to form the outer tube 20. Further, the outer tube 20 may be formed of a material which makes the outer tube 20 substantially rigid or of a material which provides a degree of flexibility. The second end of the outer tube 20 is closed by an end cap 26, shown in FIGS. 6 and 10, which is attached to the second end 24 of the tube 20 by welding, press fit, threads, etc.

An optional inner tube 30 is disposed within the outer tube 20 and extends over a substantial portion of the length of the outer tube 20, at least through a measurement area determined by the range of movement of a magnet, such as magnet 32 shown in FIG. 1. along the outer surface of the outer tube 20. A plurality of annular spacers, not shown, are positioned along the inner surface of the outer tube 20 to support the inner tube 30 within the outer tube 20 and to center at least a substantial portion of the inner tube 30 within the outer tube 20. The spacers, such as spacers 34 described above and shown in FIG. 4 are formed of a non-magnetic material such as plastic, brass, etc.

Figure 7:
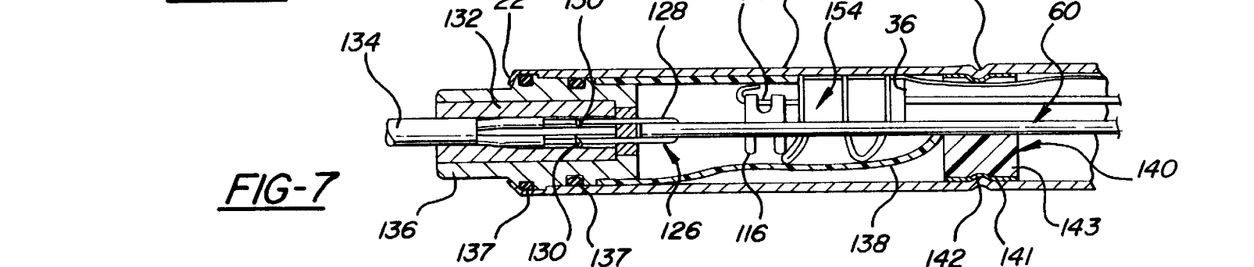
FIG. 7 is a cross-sectional view generally taken along line 7—7 in FIG. 6.
Figure 9:
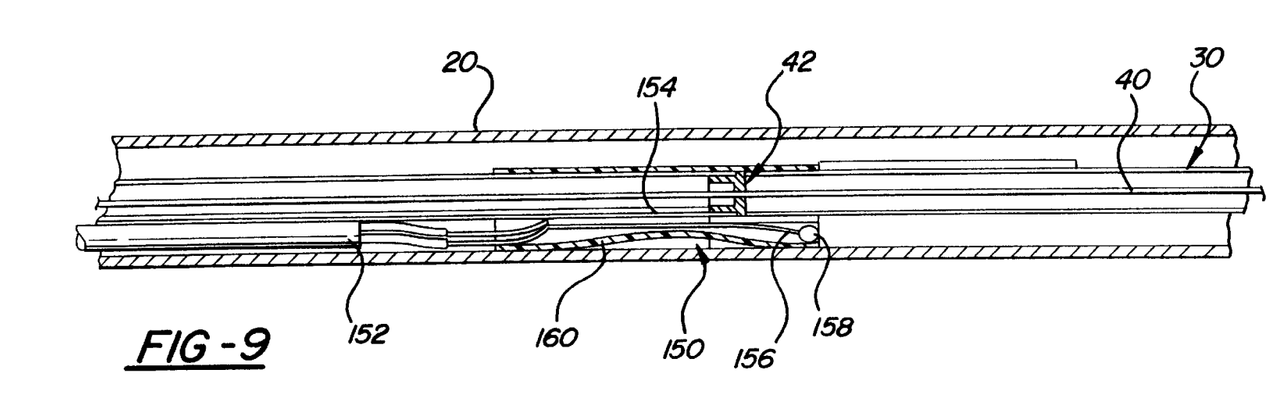
FIG. 9 is a cross-sectional view generally taken along lines 9—9 in FIG. 6.
Figure 10:
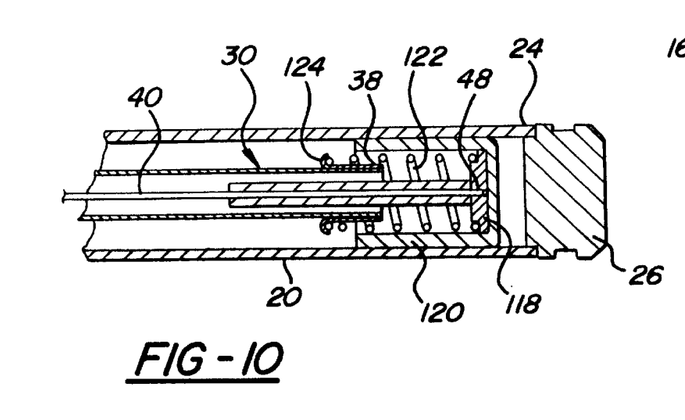
FIG. 10 is a cross-sectional view generally taken along line 10—10 in FIG. 6.

As shown in FIGS. 7 and 10, the inner tube 30 has an open first end 36 and an open second end 38. A thin magnetostrictive wire 40 is disposed with the inner tube 30 and held therein by means of a plurality of annular spacers, such as spacer 42 shown in FIG. 9, which are formed of a suitable magnetic transmissive material, such as plastic, brass, etc.

The magnetostrictive wire 40 is preferably formed of a nickel/iron alloy. A material known as Nyspan C is suitable for use as the magnetostrictive wire 40 has a first end 44 and an opposed second end 48.

The first end 44 of the magnetostrictive wire 40 is coupled to a signal pick up means 54. In the embodiment shown in FIG. 7, the pickup means 54 is in the form of a coil fixedly mounted on a substrate or circuit board 60, described hereafter. The coil, also denoted by reference number 54, concentrically surrounds the first end of the wire 44. In an exemplary embodiment, the coil 54 is formed of two oppositely wound coil sections to provide a sharper output pulse. Two conductors extend from the coil 54 to connections on the circuit board 60. The first end 44 of the wire 40 is fixedly connected to a terminal 116 which is fixedly mounted on the circuit board 60.

Alternately, the pickup means 54 may comprise a piezoelectric transducer in the form of a small, piezoelectric crystal which is clamped to the first end 44 of the magnetostrictive wire 40. The piezoelectric crystal operates as a transducer such that when high voltage is applied across the faces of the crystal by means of signal wires attached to the crystal, the crystal expands longitudinally or in a direction transverse to the length of the wire 40. This imparts a localized torsional strain on the wire 40 which propagates in both directions along the wire 40.

The second end 48 of the wire 40 is fixedly connected, such as by soldering, to a reflective terminal 118 as shown in FIG. 10. The reflective terminal 118 is enclosed in the end of a tubular sleeve 120 which has an opposed open end. A biasing means such as a brass compression spring 122, is fixed by soldering at a first end to the reflective terminal 118 and at a second end to a stop 124, such as an eyelet, which is mounted or soldered to the outer surface of the inner tube 30. The spring 122 exerts a biasing force on the second end 48 of the wire 40 to maintain the wire 40 in a substantially extended, straight position within the inner tube 30.

The tubular sleeve 120, which is preferably formed of a plastic insulation material for electrical isolation between the inner tube 30 and the outer tube 20, is slidably disposed within the outer tube 20. However, since the stop or eyelet 124 is fixedly mounted adjacent the second end 38 of the inner tube 30, the biasing spring 122 is capable of urging the reflective terminal 118 and the sleeve 120 toward the second end 24 of the outer tube 20 to maintain the magnetostrictive wire 40 in a generally straight position within the inner tube 30.

Referring again to FIG. 7, the printed circuit board 60 is disposed completely within the outer tube 20. Terminal pads on the circuit board 60 receive solder connections to various conductors. Pads are provided on the circuit board 60 for receiving solder to fixedly mount the first end portion of the inner tube 30 to the circuit board 60. Similar solder connections are provided at the opposite end of the printed circuit board 60, not shown, for joining the opposite end of the printed circuit board 60 to the inner tube 30. Additional apertures are formed in the circuit board 60 for passage of the pair of wires from the pickup coil 54 to appropriate circuit connections on the circuit board 60. Suitable signal processing and generating circuitry conventionally found in liquid level and position detector circuits utilizing magnetostrictive wires are mounted on the circuit board 60. Such circuitry may include circuitry disclosed in U.S. Pat. Nos. 4,943,773; 5,050,430; 5,258,707; 5,274,328; 5,406,200 and 5,412,316, the relevant portions of which pertaining to the liquid level and position detection circuitry are incorporated herein by reference.

A return wire circuit is formed through the second end 48 of the wire 40, the termination 118, the spring 122, the inner tube 30 and the solder connections between the inner tube 30 and the circuit board 60.

A pair of conductors 126 and 128 extend from soldered terminal pads on the circuit board 60 to glass filled seal connections 130 mounted within a sleeve 132. The sleeve 132 receives external conductors 134 which has individual leads connected to the glass filled seal connections 130. The sleeve 132 is mounted in an outer seal member 136 which is fixedly mounted in the first end 22 of the outer tube 20 by roll crimping the first end 22 of the outer tube 20 about an intermediate shoulder on the outer seal member 136. O-rings 137 are interposed between the outer seal member 136 and the adjacent outer tube 20.

After the inner tube 30 and the terminal 116 have been joined to the circuit board 60, a sleeve or tube 138 of heat shrinkable insulating material is slid over the circuit board 60 and the first end portion of the tube 30 before heat is applied to shrink the tube 138 tightly about all of the components on the circuit board 60, the pickup means 54, the terminal 116 and the first end portion of the inner tube 30.

Figure 6:
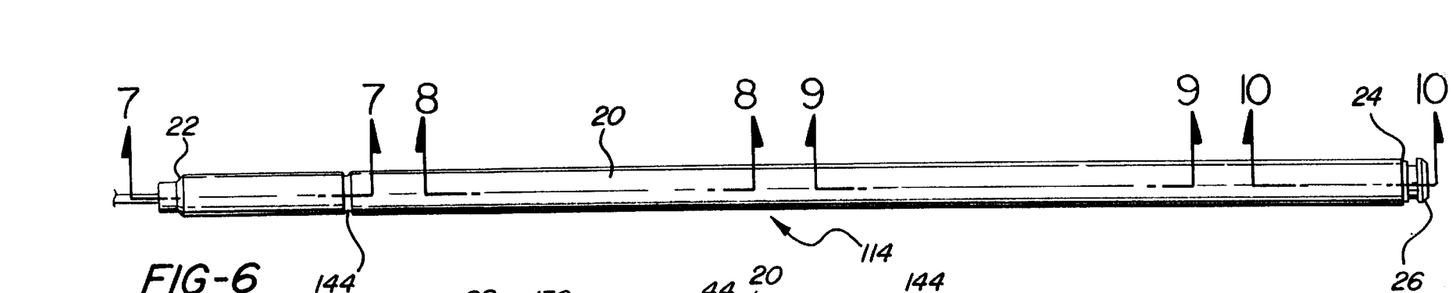
FIG. 6 is a side elevational view of another embodiment of a position detector of the present invention.

As shown in FIGS. 6 and 7, means are provided for clamping the outer tube 20 to the inner tube 30 and the printed circuit board 60 as well as to center the circuit board 60 substantially concentrically within the outer tube 20. The clamping means preferably comprises a crimp collar 140 having a generally annular shape and formed of an outer preferably metallic ring 141 with an annular groove 142 and an inner, plastic disc 143 having a slot extending therethrough for mounting the disc 143 about a flat portion of the circuit board 60. The crimp collar 140 is positioned along the circuit board 60 generally at a location close to the first end 22 of the outer tube 20.

In use, after the circuit board 60, the inner tube 30, and the sleeve 122 are positioned in the outer tube 20, a suitable tool is used to form a depression or crimp in the outer tube 20 at the location of the annular groove 142 in the crimp collar 140 thereby forming an annular groove 144 in the outer tube 20 which engages the annular groove in the crimp collar to fixedly position the circuit board 60 and the inner tube 30 relative to the outer tube 20.

Figure 8:
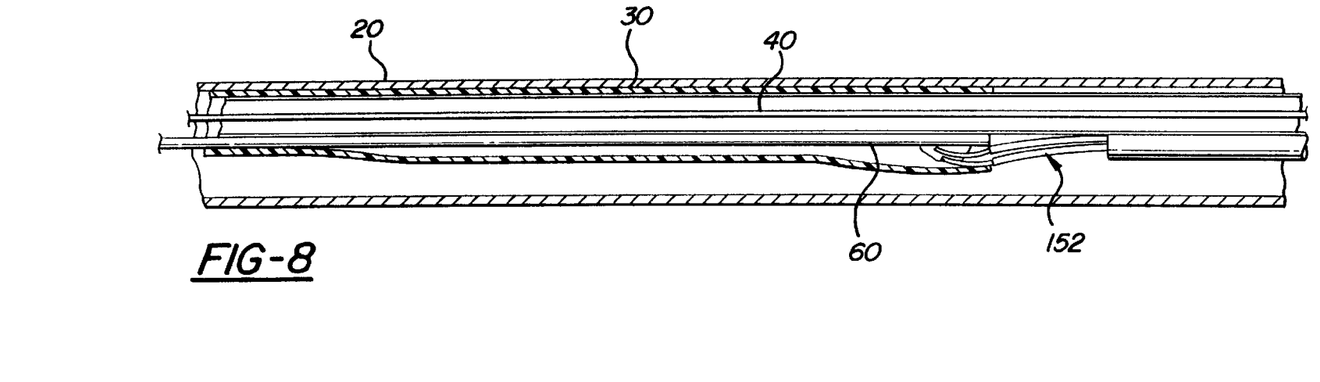
FIG. 8 is a cross-sectional view generally taken along line 8—8 in FIG. 6.

One or more temperature sensors 150, are fixedly mounted at spaced locations along the length of the inner tube 30 as shown for one temperature sensor 150 in FIGS. 8 and 9. A pair of conductors 152 are connected to the circuit board 60 on suitable terminal pads, not shown. The other end of the conductor 152 is connected, such as by soldering, to terminal strips on a support or small circuit board 154 which is soldered or otherwise fixedly mounted to the inner tube 30 at a position where the temperature of the surrounding ambient environment is to be determined. Conductive traces on the support 154 are connected to the thermistor 158. An outer coating or tube of a suitable insulating material, such as a heat shrink plastic 160, surrounds the support 154 and the connections to the conductor 152. The thermistor 158 projects outwardly from the insulating tube 160.

Additional conductors 152, not shown, may extend from connections on the circuit board 60 to additional temperature sensors 150 spaced at appropriate locations along the length of the inner tube 30.

Figure 11:
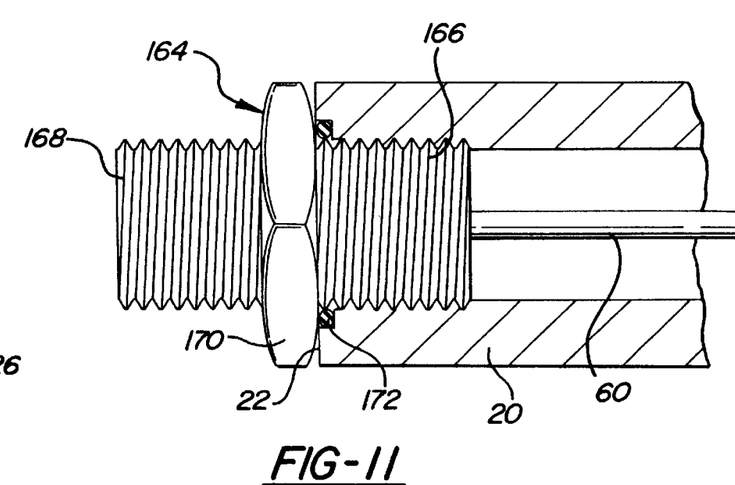
FIG. 11 is a longitudinal cross-sectional view, generally similar to FIG. 7, but showing an alternate embodiment of a pin connector mounted on the outer tube.

As shown in FIG. 11, there is depicted an alternate end connector or adapter 164 which is mounted in the threaded end 22 of the outer tube 20. In this embodiment, the end connector 164 is a multi-pin connector containing a plurality of pins within an outer sleeve or housing which are engagable or attachable to the conductors at one end and mating pins or sockets in a mating connector, not shown, at another end. For example, the end connector 164 may be a Micro-Change single keyway M14×1 male receptacle which external threads which is manufactured by Brad Harrison.

A first end 166 of the end connector 164 is threadingly mounted in the first end 22 of outer tube 20. The opposite end 168 of the end connector projects outwardly from a hex collar 170. An O-ring 172 is seated between the first end 22 of the tube 20 and the collar 170.

Figure 12:
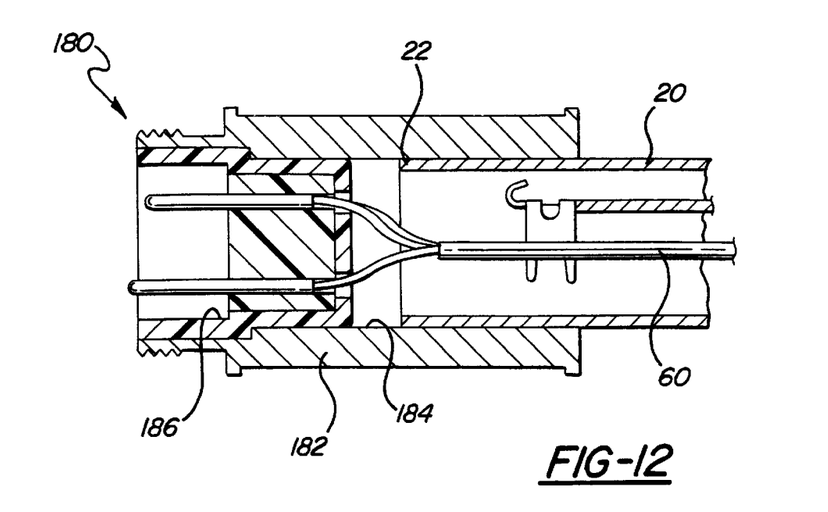
FIG. 12 is a longitudinal cross-sectional view, similar to FIG. 7, showing another embodiment of a pin connector mounted in the outer tube.

Another embodiment of an end connector 180 is shown in FIG. 12. In this embodiment, an adapter 182 in the form of a tubular sleeve is fixedly mounted, such as by welding, to the first end 22 of the outer tube 20. The adapter 182 has an internal bore 184 extending from a first end with an inner diameter equal to the outer diameter of the outer tube 20 to provide a close fit therebetween when the adapter 182 is mounted on the outer tube 20 as shown in FIG. 12.

A stepped bore 186 extends from an opposite end of the adapter 182 and receives a first end of an insert 188, such as a Mini-change 2-6 pole receptacle insert from Brad Harrison.

In both embodiments shown in FIGS. 11 and 12, the internal sleeve of each pin connector 164 or insert 188 could be used by itself, without the threaded outer housing, and press fit or otherwise fixedly mounted in the end of the outer tube 20.

Figure 13:
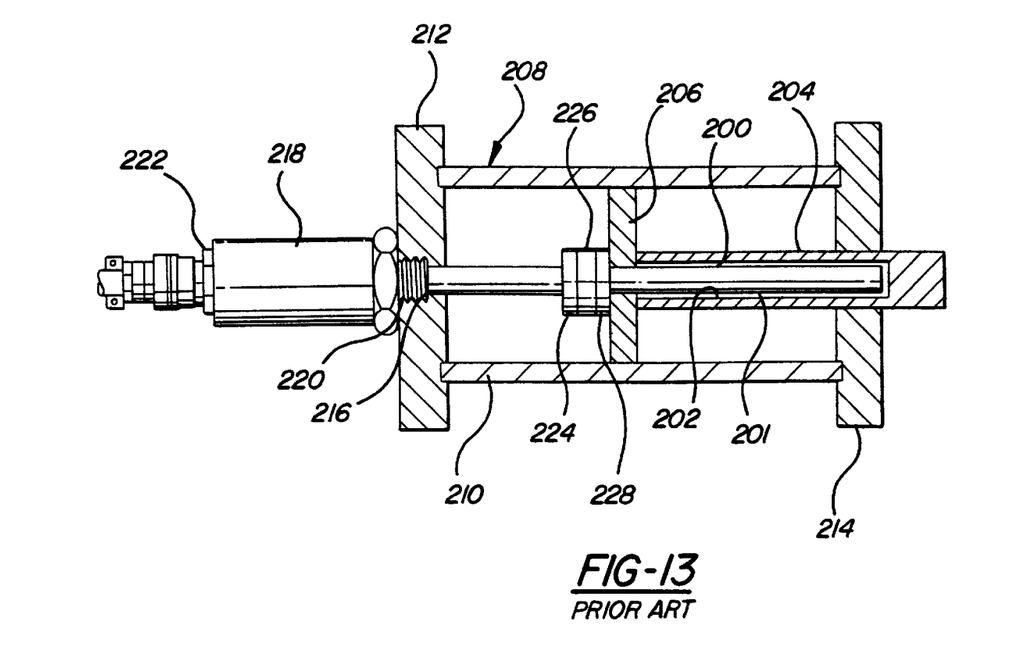
FIG. 13 is a longitudinal cross-sectional view showing the prior art mounting of a linear displacement transducer in a pressurized fluid operated cylinder.

The present apparatus is also employed as a linear displacement transducer or position detector. FIG. 13 depicts a prior art linear displacement transducer utilizing a conventional position detector 200. The outer tube 201 of the transducer 200 is mounted in a bore 202 in a piston rod 204 fixedly connected to a piston 206 slidably mounted in a pressurized fluid operated cylinder 208. As is conventional, the cylinder 208 is formed of a generally cylindrical sidewall 210 mounted between opposed end caps 212 and 214. One end of the piston rod 204 slidably and reciprocally projects through an aperture in the end wall 214.

The outer tube 201 of the transducer 200 is fixedly mounted in the cylinder 208 between the end walls 212 and 214 by means of a threaded adapter 216 which is threadably mounted within a threaded bore in the end cap 212. The adapter 216 is fixedly mounted on one end of the outer tube 201, such as by welding. An enlarged housing or head 218 containing the pickup means and processing circuitry associated with the magnetostrictive wire mounted within the tube 201 is externally coupled to the adapter 216 and is disposed externally of the end cap 212 as shown in FIG. 13. An O-ring seal 220 is interposed between a threaded nut and the adapter 216. A suitable connector 222 is mounted on the head 218 for connecting external conductors to the head 218.

An optional bushing 224 is mounted on the rod 201 adjacent a magnet 226 and a spacer 228. The magnet 226, the spacer 228 and the optional bushing 224 are fixedly mounted to the piston 206 and moveable therewith depending on which chamber within the cylinder 208 is pressurized with fluid. In this manner, the magnetostrictive wire within the outer tube 201 is operative to sense the position of the magnet 226 and, thereby, the piston 206 connected thereto at any position of the piston 206 within the cylinder 208.

However, the enlarged diameter and length of the head 218 on the end of the rod 201 necessitates that the head 218 be mounted externally of the end wall 212 of the cylinder 208. This is acceptable in applications where the end wall 212 of the cylinder 208 is not closely spaced to adjacent equipment. However, in certain applications, the cylinder 208 is mounted to adjacent components at the end wall 212 thereby prohibiting the linear displacement transducer 200 shown in FIG. 13 from being employed in these applications.

Figure 14:
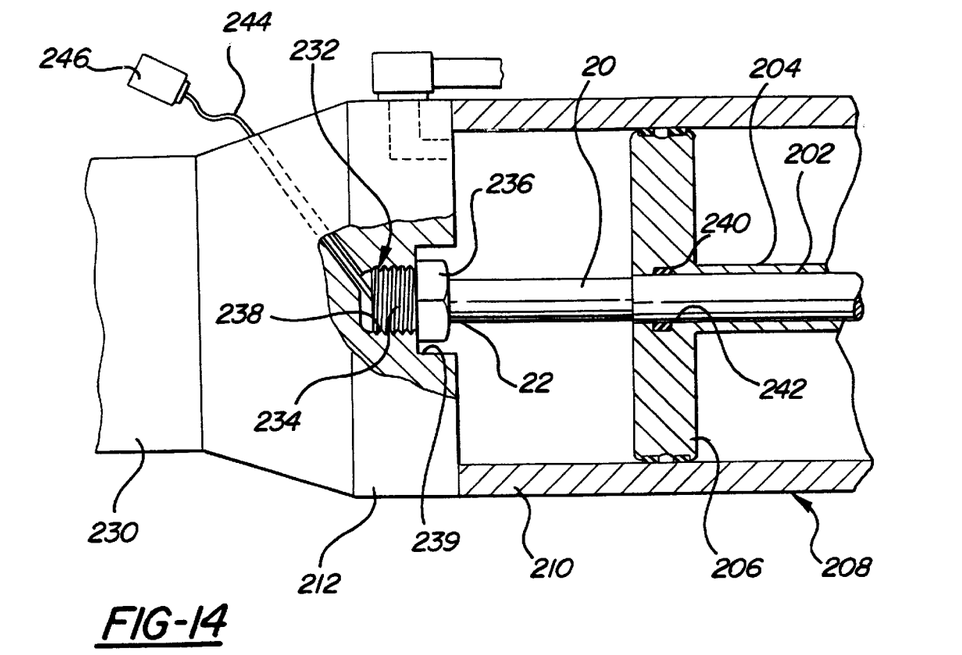
FIG. 14 is a partially cross-sectioned view depicting a first embodiment of a cylinder mounted position detector according to the present invention.

FIG. 14 depicts a linear displacement transducer or position detector utilizing the apparatus 20 described above and shown in FIGS. 6–10 which enables a pressurized, fluid operated cylinder to be mounted at the end wall 212 to an adjacent component, such as a mounting trunnion shown by way of example only in FIG. 14. The trunnion 230 is fixedly joined, such as by welding, to the end wall or cap 212. In this embodiment the outer tube 20 has an adapter 232 fixedly mounted, such as by welding, to the first end 22. The adapter 232 includes a threaded first end 234 and a hex nut 236, with the threaded end 234 projecting outwardly from the first end 22 of the outer tube 20. A bore 238 is formed generally centrally in the end cap or wall 212 and receives the threaded end 234 of the adapter 232 to fixedly mount the outer housing 20 to the end wall 212 of the cylinder 208. The hex nut 236 seats within an enlarged end portion 239 of the bore 238 and faces into the interior of the cylinder 208.

At least one magnet 240, such as an annular magnet, or a plurality of circumferentially spaced magnets 240 are fixedly mounted to the inner surface of a bore 242 in the piston 206. The magnets 240 are slidingly moveable with the piston 206 along the length of the outer housing 20 concurrent with the movement of the piston 206 within the cylinder 208 depending upon which chamber in the cylinder 208 on either side of the piston 206 is filled with pressurized fluid.

A conductor, such as a two wire conductor 244, extends through the end wall 212 and a bore in the trunnion 230 to a sealed connection at one end to the conductors in the outer tube 20 and an external connector 246, such as a Deutsch Connector, Model No. DT04-2P-EP.

Figure 15:
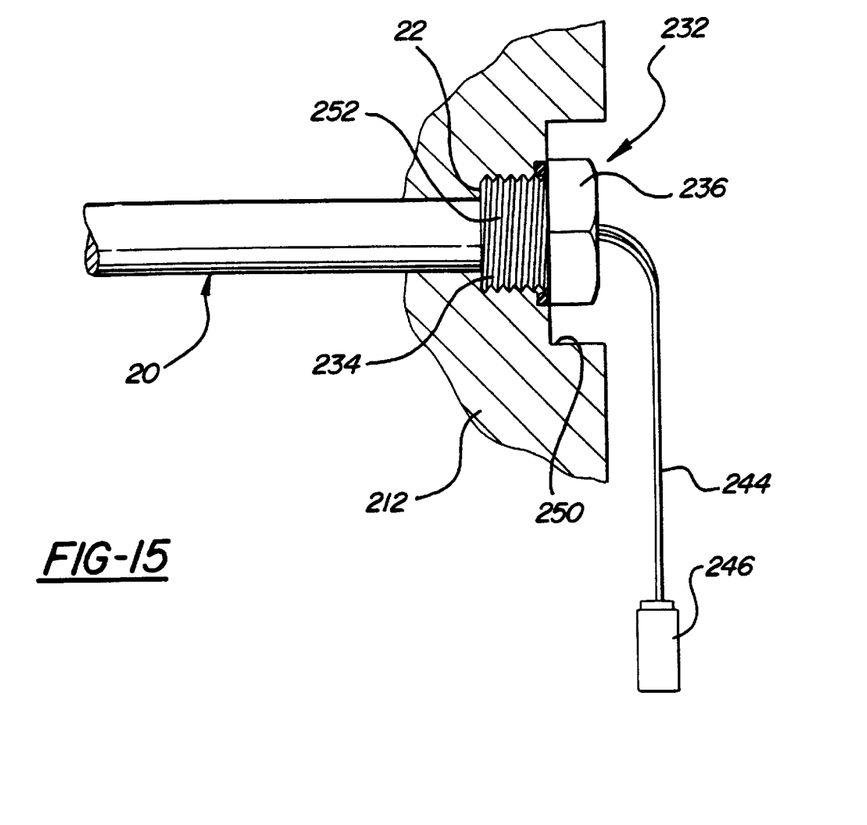
FIG. 15 is a partially cross-sectioned view of a second embodiment of a cylinder position detector according to the present invention.

FIG. 15 depicts another embodiment of the present invention employed as a linear displacement transducer in a fluid operated cylinder. In this embodiment, the adapter 232 is mounted in a reverse manner from that shown in FIG. 14 on the first end 22 of the outer tube 20. In this embodiment, the adapter 232 has the threaded end portion 234 fixedly joined to the first end 22 of the outer tube 20, such as by welding. The threaded end 234 of the adapter 232 threadingly engages a threaded bore 252 in the end wall 212. The hex nut 236 is positioned within a bore 250 in the end wall 212 which opens exteriorly of the end wall 212. However, the end wall 212 can still be mounted to the trunnion 230, as shown in FIG. 14. The conductor 244 extends from the interior of the outer tube 20 to the external connector 246 in the same manner described above in FIG. 14.

In summary, there has been disclosed a unique position or liquid level detecting apparatus in which all of the operative components of the apparatus are contained within a generally constant diameter outer pipe having a small diameter which is readily mountable in existing tank apertures. Pin connectors are mounted in the end of outer pipe for connection to mating pin conductors on external electrical conductors.

Assembly of the position or liquid level detecting apparatus is simplified since the circuit board can be fixedly mounted directly to the inner tube and centered within the outer tube by means of an annular disc mounted about the circuit board and to which the outer tube is crimped.

In a fluid operated cylinder application, the unique position detecting apparatus of the present invention can be mounted within the cylinder such that all operative components of the position detecting apparatus, including any mounting fittings, are contained completely within the exterior surface of an end wall of the cylinder thereby enabling the position detecting apparatus to be employed in all cylinder mounting applications, particularly those which mount the cylinder via the end wall to other components, such as pivotal trunnions.

What is claimed is:

1. A position detector apparatus having a magnetostrictive wire extending through a measurement field with at least one magnet moveable through the measurement field for providing disturbances in the magnetostrictive wire, the apparatus comprising:

an outer magnetic transmissive tube having a substantially linear sidewall extending between opposed first and second ends;

a magnetostrictive wire fixedly mounted in and completely contained within the outer tube;

pickup means, mounted within the outer tube and coupled to the magnetostrictive wire, for outputting signals propagating along the magnetostrictive wire;

circuit means, disposed completely within the outer tube, for coupling electrical signals to the magnetostrictive wire and the pickup means and for transmitting electric signals from the magnetostrictive wire and the pickup means; and fitting means, fixedly mounted in the first end of the outer tube and containing a plurality of pins electrically engagable at one end to conductors extending from the circuit means, for connecting to external conductors.

2. The apparatus of claim 1 wherein:

the fitting means includes a plurality of threads threadingly matable with an external threaded connector.

3. The apparatus of claim 1 wherein:

the fitting means includes a plurality of threads matable with threads on the first end of the outer tube.

4. The apparatus of claim 1 wherein the fitting means comprises:

connector means, mounted in the first end of the outer tube, for connecting electrical conductors from the circuit means in the outer tube to external conductors.

5. The apparatus of claim 4 wherein:

the connector means comprises a multi-pin connector.

6. The apparatus of claim 5 wherein the connector means:

a connector having a plurality of external threads at a first end, the external threads engagable with internal threads formed in the first end of the outer tube.

7. The apparatus of claim 5 wherein the connector means comprises:

a connector having a plurality of external threads at a second end engageable with a threaded external connector.

8. The apparatus of claim 1 wherein the fitting means comprises:

an adapter fixed on the first end of the outer tube; and an insert mounted in the adapter, the insert carrying the pins.

9. The apparatus of claim 8 wherein the adapter further comprises:

a plurality of threads at one end adapted to be engagable with a threaded external connector.

10. The apparatus of claim 1 wherein the mounting means comprises:

an annular member disposed about the circuit means and having a peripheral annular groove; and an annular depression formed in the outer tube engaging the annular groove in the annular member to fixedly join the outer tube, the annular member and the circuit means in a fixed relationship.

11. The apparatus of claim 10 wherein:

the mounting means centrally disposes the circuit means within the outer tube.

12. A position detector apparatus used with a fluid operated cylinder having a piston slidably mounted within an interior chamber between opposed first and second end walls, and a piston rod fixed on the piston and extensibly projecting through an aperture in the second end wall, the position detector apparatus comprising:

an outer magnetic transmissive tube having opposed first and second ends;

a magnetostrictive wire fixedly mounted within the outer tube;

pickup means, mounted within the outer tube and coupled to the magnetostrictive wire, for outputting signals propagating along the magnetostrictive wire;

circuit means, disposed completely within the outer tube, for coupling electrical signals to the magnetostrictive wire and the pickup means and for transmitting electric signals from the magnetostrictive wire and the pickup means;

a magnet mounted in the piston;

the piston rod slidably receiving the outer tube therein; and means, carried on a first end of the outer tube, for fixedly mounting the first end of the outer tube to the first end wall of the cylinder, the mounting means non-protrudingly disposed from the exterior surface of the first end wall.

13. The position detector apparatus of claim 12 further comprising:

a bore formed in the first end wall having a first bore portion and a threaded second bore portion;

an adapter, fixedly carried on the first end of the outer tube, and positionable in the first bore portion, the adapter having a threaded end portion threadingly engagable with the threaded second bore portion in the first end wall of the cylinder to fixedly mount the outer tube to the first end wall of the cylinder.

14. The apparatus of claim 13 further comprising:

conductors extending from the circuit means in the outer tube through a first end of the outer tube and the adapter to an external connector.

15. The apparatus of claim 13 wherein:

the first end wall of the cylinder has first and second opposed surfaces, the second surface facing the interior chamber within the cylinder;

the threaded bore portion extending from the second surface.

16. The apparatus of claim 15 further comprising:

the adapter having a nut portion seated within the first bore portion in the first end wall.

17. The apparatus of claim 13 wherein:

the first end wall has first and second surfaces, the second surface facing the interior chamber within the cylinder;

the first bore portion extending from the first surface of the end wall; and the adapter having a nut portion disposable within the first bore portion in the first end wall.

18. A position detector apparatus having a magnetostrictive wire extending through a measurement field with at least one magnet moveable through the measurement field for providing disturbances in the magnetostrictive wire, the apparatus comprising:

an outer magnetic transmissive tube having opposed first and second ends;

a magnetostrictive wire fixedly mounted within the outer tube;

pickup means, mounted within the outer tube and coupled to the magnetostrictive wire, for outputting signals propagating along the magnetostrictive wire;

circuit means, disposed completely within the outer tube, for coupling electrical signals to the magnetostrictive wire and the pickup means and for transmitting electric signals from the magnetostrictive wire and the pickup means;

means for centrally mounting the circuit means within the outer tube, the mounting means including an annular member fixedly disposed about the circuit means; and means for fixedly joining the annular member to the outer tube.

19. The apparatus of claim 18 wherein the mounting means further comprises:

the annular member having a peripheral annular groove; and the means for fixedly mounting including an annular depression formed in the outer tube in engagement with the annular groove in the annular member to fixedly join the outer tube, the annular member and the circuit means in a fixed relationship.

* * * * *